(12) United States Patent
Matsuyama

(10) Patent No.: US 8,295,026 B2
(45) Date of Patent: Oct. 23, 2012

(54) ELECTROSTATIC CHUCK AND SUBSTRATE PROCESSING APPARATUS HAVING SAME

(75) Inventor: Shoichiro Matsuyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 12/581,343

(22) Filed: Oct. 19, 2009

(65) Prior Publication Data
US 2010/0118464 A1    May 13, 2010

(30) Foreign Application Priority Data
Nov. 13, 2008  (JP) ................. 2008-291376

(51) Int. Cl.
*H01T 23/00* (2006.01)
(52) U.S. Cl. ........................ 361/234; 361/230
(58) Field of Classification Search .......... 361/234, 361/230
See application file for complete search history.

(56) References Cited

U.S. PATENT DOCUMENTS

| | | | |
|---|---|---|---|
| 6,558,508 B1 * | 5/2003 | Kawakami | 156/345.51 |
| 8,130,334 B2 * | 3/2012 | Okabe | 349/43 |
| 2005/0018379 A1 * | 1/2005 | Ito | 361/302 |

FOREIGN PATENT DOCUMENTS

JP   2000-332089   11/2000

* cited by examiner

*Primary Examiner* — Danny Nguyen
(74) *Attorney, Agent, or Firm* — Oblon, Spivak, McClelland, Maier & Neustadt, L.L.P.

(57) ABSTRACT

In an electrostatic chuck provided inside a processing chamber of a substrate processing apparatus and including a high voltage electrode plate for electrostatically attracting a target substrate, a heater includes a plate-shaped resistor and two electrode plates respectively brought into surface-contact with a front surface and a rear surface of the resistor, and one of the two electrode plates of the heater serves as the high voltage electrode plate for electrostatically attracting the target substrate.

10 Claims, 4 Drawing Sheets

ELECTROSTATIC CHUCK AND SUBSTRATE PROCESSING APPARATUS HAVING SAME

CROSS-REFERENCE TO RELATED APPLICATIONS

This application claims priority to Japanese Patent Application No. 2008-291376 filed on Nov. 13, 2008, the entire contents of which are incorporated herein by reference.

FIELD OF THE INVENTION

The present invention relates to an electrostatic chuck and a substrate processing apparatus having same; and, more particularly, to an electrostatic chuck for use in a substrate processing apparatus in which a semiconductor device is subjected to a reactive ion etching (RIE) process using a plasma and a substrate processing apparatus having same.

BACKGROUND OF THE INVENTION

A substrate, e.g., a semiconductor wafer, is subjected to a plasma processing such as an etching process in a substrate processing apparatus. The substrate processing apparatus includes an airtightly sealed processing chamber and a mounting table arranged therein to mount a target substrate thereon. Then, a plasma is generated in the processing chamber and the plasma processing is performed by applying the generated plasma to the target substrate.

In the substrate processing apparatus, a heater for heating the substrate and an attracting electrode plate for holding the substrate, for example, are provided inside an electrostatic chuck (ESC) of the mounting table to hold the target substrate and maintain the temperature of the substrate adequate for the plasma processing.

A conventional art related to such the electrostatic chuck is disclosed in e.g., Japanese Patent Laid-open publication No. 2000-332089. The conventional art discloses an electrostatic chuck developed to obtain an easily controllable strong attractive force for holding a wafer flat, and to adequately heat the wafer without temperature irregularity. Specifically, the disclosed electrostatic chuck for heating and holding the wafer has a wafer plate including a bipolar electrostatic chuck portion for holding the wafer flat and a heating portion for heating the wafer by using an AC power supply. In the electrostatic chuck, at least one of the bipolar electrodes of the electrostatic chuck portion serves as a heater of the heating portion.

FIG. 5 is a partially enlarged cross sectional view showing an electrostatic chuck 80 according to the conventional art. In FIG. 5, the electrostatic chuck 80 includes an electrostatic chuck main body 81, a high voltage (HV) electrode plate 82 provided in the electrostatic chuck main body 81, a spiral heater 83, and DC power supplies 84 to 86 for supplying DC powers to the HV electrode plate 82 and the heater 83.

Such the electrostatic chuck 80 is manufactured by a hot press (sintering) method, for example. Specifically, inner and outer spiral resistors to be formed as the heater 83, a ceramic plate body to be formed as an intermediate layer of the electrostatic chuck 80, and the HV electrode plate 82 are coated on a ceramic plate body to be formed as a bottom surface of the electrostatic chuck main body 81.

Then, a ceramic plate body to be formed as a top surface of the electrostatic chuck 80 is stacked on the coated ceramic plate body. Thereafter, the electrostatic chuck 80 is fabricated by hot pressing the thus-provided layers of the electrostatic chuck 80.

When the layers are prepared, the sizes thereof are made to be greater than their final sizes, considering a distortion caused by the hot press. Accordingly, after such a press forming, the hot pressed body is polished into the desired size. The completed electrostatic chuck 80 is adhesively joined to a support plate 90 by using, e.g., an adhesive 87.

Since, however, the conventional electrostatic chuck employs such a spiral heater, a certain gap is required between the heater and a mounting surface of the substrate to remove the temperature irregularity caused by a heat transfer pattern from the spiral heater. Accordingly, the electrostatic chuck can not be made thin, and thus suffers from poor start-up property in heating the substrate and low response speed to temperature control.

Moreover, since the conventional electrostatic chuck is adhesively joined to such a base by using an adhesive, it is difficult to obtain a high thermal conductivity. Furthermore, due to the costly hot pressing process, the manufacturing cost of the electrostatic chuck is high and, thus, is economically unfavorable.

SUMMARY OF THE INVENTION

In view of the above, the present invention provides a thin electrostatic chuck having a high responsivity to temperature control and a substrate processing apparatus including same.

In accordance with an aspect of the present invention, there is provided an electrostatic chuck provided inside a processing chamber of a substrate processing apparatus and including a high voltage electrode plate for electrostatically attracting a target substrate. The electrostatic chuck includes a heater which includes a plate-shaped resistor and two electrode plates respectively brought into surface-contact with a front surface and a rear surface of the resistor. One of the two electrode plates of the heater serves as the high voltage electrode plate for electrostatically attracting the target substrate.

In accordance with another aspect of the present invention, there is provided a substrate processing apparatus including a processing chamber and an electrostatic chuck provided inside the processing chamber to mount the target substrate thereon.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

Figure 1:
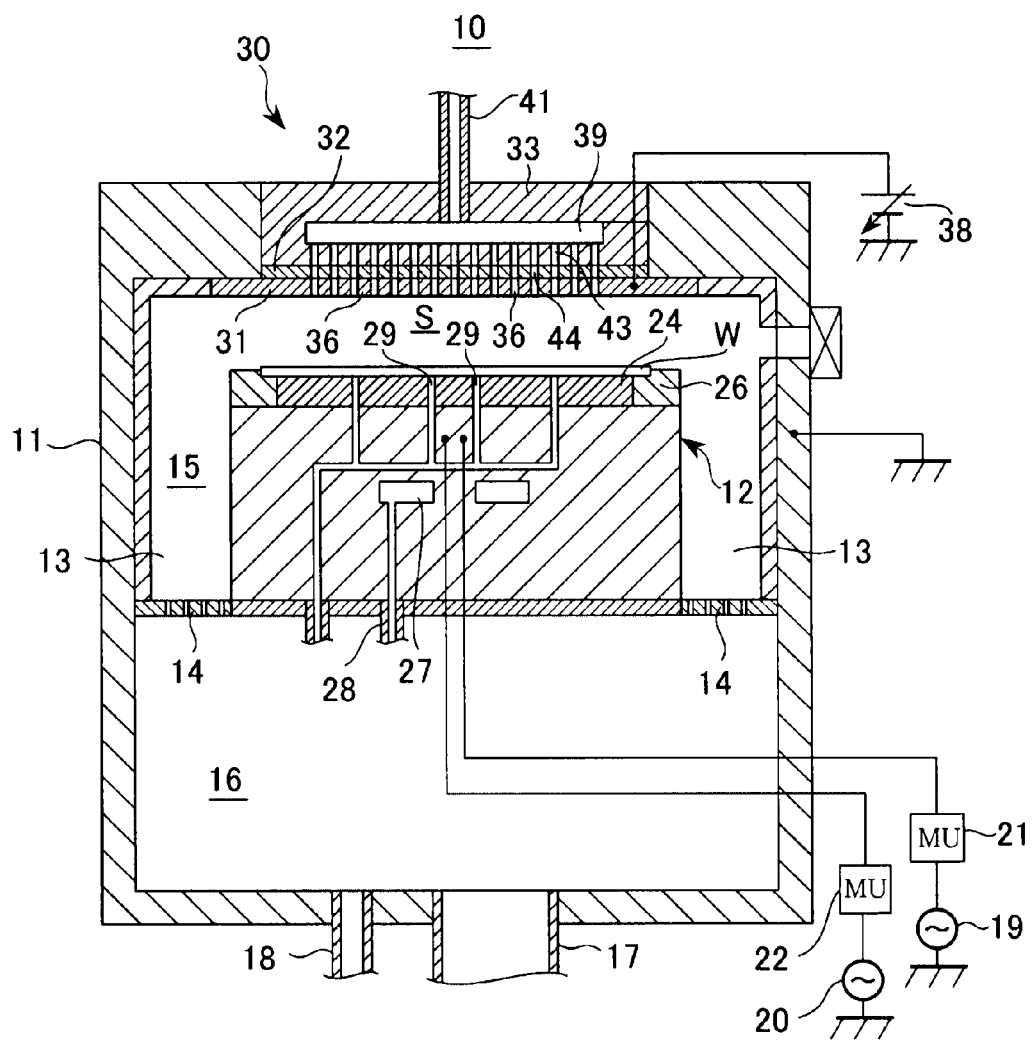
FIG. 1 is a schematic cross sectional view showing a structure of a substrate processing apparatus in accordance with an embodiment of the present invention.

FIG. 1 is a schematic cross sectional view showing a structure of a substrate processing apparatus 10 in accordance with an embodiment of the present invention.

In FIG. 1, the substrate processing apparatus 10 is configured to subject a wafer to a reactive ion etching (RIE) process or a dry etching process.

The substrate processing apparatus 10 includes a cylindrical processing chamber 11 and a cylindrical susceptor 12 arranged inside the processing chamber 11 to mount a wafer W having a diameter of, e.g., 300 mm thereon. The substrate processing apparatus 10 further includes a gas exhaust path 13 through which a gas inside a processing space S is exhausted to an outside of the processing chamber 11, the gas exhaust path 13 being formed by an inner wall of the processing chamber 11 and a side surface of the susceptor 12; and an exhaust plate 14 arranged in the gas exhaust path 13.

The exhaust plate 14, which is a plate-shaped member having a plurality of through holes, serves as a partition wall that divides an inner space of the processing chamber 11 into an upper space 15 and a lower space 16. A plasma is generated in the upper space 15 (hereinafter, referred to as a reaction chamber) of the processing chamber 11. Exhaust pipes 17 and 18, through which a gas inside the processing chamber 11 is discharged, are connected to the lower space 18 (hereinafter, referred to as an exhaust chamber (manifold)) of the processing chamber 11. The exhaust plate 14 is used to prevent a plasma generated in the reaction chamber 15 from leaking to the manifold 16 by capturing and reflecting the plasma.

A turbo molecular pump (TMP) (not shown) is connected to the exhaust pipe 17 and a dry pump (DP) (not shown) is connected to the exhaust pipe 18 to exhaust the inside of the chamber 11 to a vacuum level. Specifically, the DP lowers the pressure inside the processing chamber 11 from the atmospheric pressure to a medium vacuum state (e.g., $1.3*10$ Pa (0.1 Torr) or less) and the TMP cooperates with the DP to lower the pressure inside the processing chamber 11 from the medium vacuum state to a high vacuum state (e.g., $1.3*10^{-3}$ Pa ($1.0*10^{-5}$ Torr) or less). The pressure inside the chamber 11 is controlled by an automatic pressure control (APC) valve (not shown).

A first and a second high frequency power supply 19 and 20 are connected to the susceptor 12 inside the processing chamber 11 via a first and a second matching unit (MU) 21 and 22, respectively. A high frequency power of a relatively high frequency, e.g., 60 MHz is supplied from the first high frequency power supply 19 to the susceptor 12. A high frequency power of a relatively low frequency, e.g., 2 MHz is supplied from to the susceptor 12. Accordingly, the susceptor 12 serves as a lower electrode to supply high frequency powers to the processing space between the susceptor 12 and a shower head 30, which will be described later. The matching units 21 and 22 prevent the reflection of the high frequency powers from the susceptor 12 to maximize the efficiency of supplying the high frequency powers to the susceptor 12.

An electrostatic chuck 24 is made of a circular plate-shaped insulating member having a high voltage (HV) electrode plate (not shown) for electrostatic attraction. The electrostatic chuck 24 is arranged at an upper portion of the susceptor 12. When the wafer W is mounted on the susceptor 12, the wafer W is arranged on the electrostatic chuck 24. The structure of the susceptor 12 will be described later in detail.

A ring-shaped focus ring 26 is mounted on the susceptor 12 to surround the wafer W attracted and held on the electrostatic chuck 24. The focus ring 26 is made of an electrically conductive member, e.g., silicon, to allow the plasma to converge uniformly on a surface of the wafer W. As a result, the efficiency of the RIE processing can be improved.

An annular coolant path 27 is provided in the susceptor 12, extending in, e.g., a circumstantial direction thereof. A coolant, e.g., a cooling water or Galden (Registered trademark), of low temperature is supplied from a chiller unit (not shown) to the coolant path 27 via a coolant line 28 to be circulated. The susceptor 12 is cooled by the low-temperature coolant; and the wafer W and the focus ring 26 are cooled by the cooled susceptor 12 via the electrostatic chuck 24.

A plurality of heat transfer gas supply holes 29 are formed at a mounting surface (hereinafter, referred to as an adsorption surface), on which the wafer W is attracted and held, at the top of the electrostatic chuck 24. A heat transfer gas, e.g., helium (He) gas, is supplied to a gap between the adsorption surface and the back surface of the wafer W via the heat transfer gas supply holes 29. A heat of the electrostatic chuck 24 is efficiently transferred to the wafer W through the He gas supplied to the gap between the adsorption surface and the back surface of the wafer W.

A shower head 30 is arranged at a ceiling portion of the processing chamber 11. In the shower head 30, an electrode holder 33 is stacked on an insulating plate 32 and the insulating plate 32 is stacked on an upper electrode 31. The upper electrode 31 is exposed to the processing space S and faces the wafer W mounted on the susceptor 12 (hereinafter, referred to as "mounted wafer W"). The insulating plate 32 is made of an insulating member. The upper electrode 31 is held by the electrode holder 33 via the insulating plate 32.

A variable DC power supply 38 is connected to the upper electrode 31 to supply a DC voltage to the upper electrode 31 therefrom. A buffer chamber 39 having a cylindrical space is provided inside the electrode holder 33. A processing gas inlet line 41 is connected to the buffer chamber 39 to supply a processing gas to the buffer chamber 39 therethrough.

A mass flow controller (MFC) (not shown) is connected to the processing gas inlet line 41 to control a flow rate of the processing gas supplied to the buffer chamber 39. The buffer chamber 39 communicates with the processing space S through gas holes 43, 44, and 36 of the electrode holder 33, the insulating plate 32, and the upper electrode 31, respectively, to supply the processing gas from the buffer chamber 39 to the processing space S. The distribution of plasma in the processing space S is controlled by adjusting the flow rate of the processing gas supplied to the buffer chamber 39.

Figure 2:
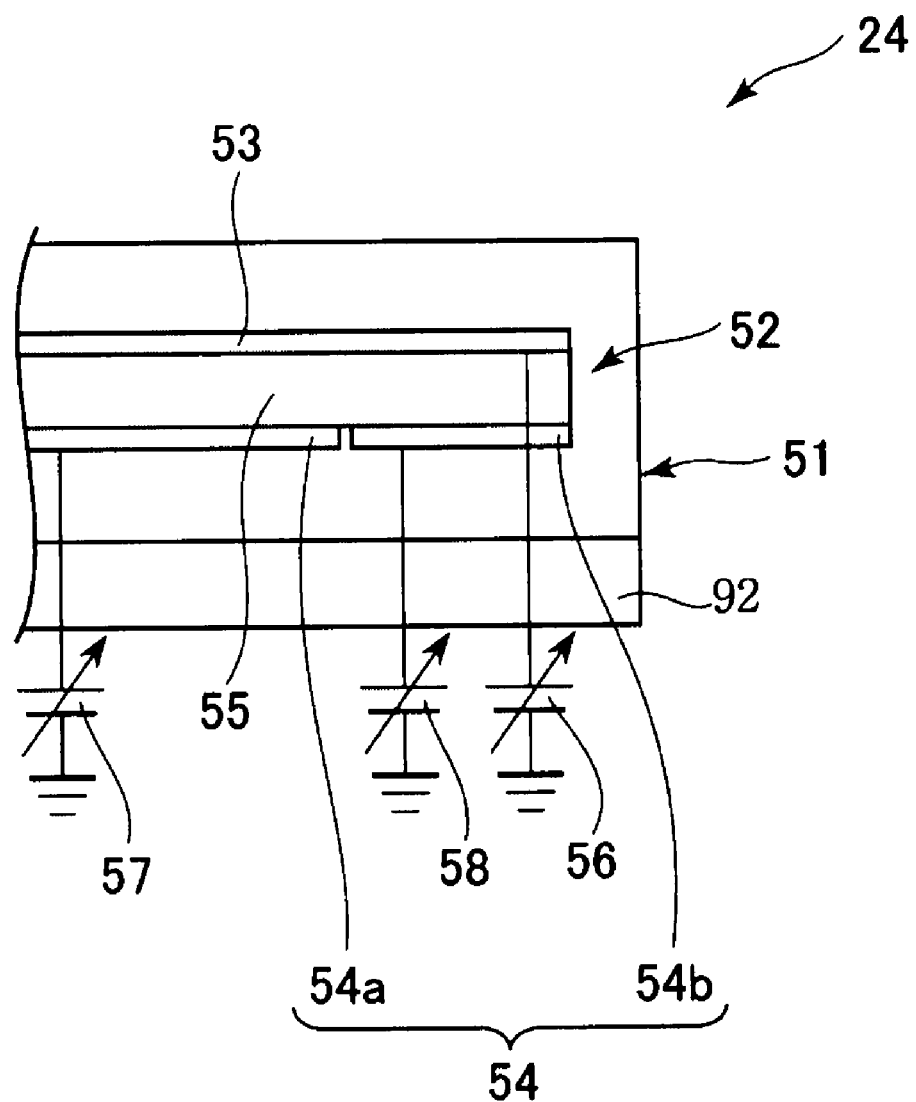
FIG. 2 is a partially enlarged cross sectional view showing an electrostatic chuck shown in FIG. 1.

FIG. 2 is a partially enlarged cross sectional view showing the electrostatic chuck 24 shown in FIG. 1.

As shown in FIG. 2, the electrostatic chuck 24 includes an electrostatic chuck main body 51 and a plate-shaped heater 52 provided inside the electrostatic chuck main body 51. The electrostatic chuck main body 51 is fixedly joined to a chuck mounting surface of the susceptor 12. The heater 52 of the electrostatic chuck 24 includes an electrode plate 53 of, e.g., a circular shape (hereinafter, referred to as "upper electrode plate") at the adsorption surface side, an electrode plate 54 (hereinafter, referred to as "lower electrode plate") opposite to the adsorption surface, and a resistor 55 of, e.g., a circular-plate shape interposed therebetween.

The lower electrode plate 54 is divided into two or more, e.g., a lower inner electrode plate 54a of, e.g., a circular shape and a lower outer electrode plate 54b of, e.g., a ring shape to locally heat the adsorption surface of the electrostatic chuck 24. The upper electrode plate 53, the lower inner electrode plate 54a, and the lower outer electrode plate 54b are electrically connected to corresponding variable DC power supplies 56, 57, and 58, respectively.

The electrostatic chuck 24 is manufactured by, e.g., a thermal spraying method. Specifically, a ceramic layer having a thickness of, e.g., 250 μm is coated on a top surface (i.e., a chuck mounting surface) of the susceptor 12 by the thermal spraying method to serve as a bottom part of the electrostatic chuck 24 as a base. Then, a layer of electrode material having a thickness of, e.g., 50 μm serving as the lower inner electrode plate 54a and the lower outer electrode plate 54b is coated on the ceramic layer to serving as the bottom surface of the electrostatic chuck 24 by the thermal spraying method.

Successively, the plate-shaped resistor 55 having a thickness of, e.g., 100 μm is coated on the lower electrode plate 54 by the thermal spraying method. Then, an electrode material having a thickness of, e.g., 50 μm to serve as the upper electrode plate 53 is coated on the plate-shaped resistor 55 by the thermal spraying method. Finally, a ceramic layer having a thickness of, e.g., 300 μm is coated on the upper electrode plate 53 by the thermal spraying method to complete the manufacture of the electrostatic chuck 24. The top surface of the 300 μm ceramic layer serves as the adsorption surface.

As the material of the plate-shaped resistor 55, a mixed material in which, e.g., $Al_2O_3$ (a ceramic) and $TiO_2$ (a metal oxide) for example, are mixed at the mixing ratio of 8:2, is employed. The resistivity p of the mixed material is $1 \times 10^7 \leq p \leq 1 \times 10^9$ Ωcm. As a result, the entire thickness of the electrostatic chuck 24 is about, e.g., 750 μm.

In the substrate processing apparatus 10 including such the electrostatic chuck 24, a substrate, e.g., a wafer W is subjected to a plasma processing such as an etching process as follows.

A target object, i.e., a wafer W, is mounted on the adsorption surface of the electrostatic chuck 24 in the processing chamber 11 and the pressure inside the processing chamber 11 is adjusted to a preset level by the APC valve (not shown). Successively, a DC voltage of, e.g., 2.5 kV is supplied from the DC power supply 56 to the upper electrode plate 53 provided inside the electrostatic chuck 24.

If a positive DC voltage is supplied to the upper electrode plate 53, a negative potential is generated on a surface on the side of the adsorption surface of the electrostatic chuck 24 of the wafer W (hereinafter, referred to as a back surface of the wafer W), thereby generating a potential difference between the upper electrode plate 53 of the electrostatic chuck 24 and the back surface of the wafer W. As a result, the wafer W is attracted to and held on the adsorption surface of the electrostatic chuck 24 by a Coulomb force or a Johnson-Rahbek force generated by the potential difference.

Moreover, DC voltages of, e.g., 2.8 kV and 3.0 kV are supplied from the DC power supplies 57 and 58 to the lower inner electrode plate 54a and the lower inner electrode plate 54b, thereby operating the heater 52 to heat an inner portion and an outer portion of the wafer W at preset temperatures, respectively.

Thereafter, an excitement high frequency power of, e.g., 60 MHz is supplied from the first high frequency power supply 19 to the susceptor 12 and a bias high frequency power of, e.g., 2 MHz is supplied from the second high frequency power supply 20 to the susceptor 12. Accordingly, the processing gas supplied from the shower head 30 to the processing space S is excited to be converted to a plasma, to thereby generate ions and radicals. By using the thus generated ions and radicals, the wafer W is subjected to a predetermined plasma processing.

In the present embodiment, since the plate-shaped resistor 55 is employed in the electrostatic chuck 24, no heat transfer pattern is produced from the heater 52 unlike in the conventional art in which the spiral heater is employed. Therefore, it is possible to make thinner the entire thickness of the electrostatic chuck 24 including the thickness between the upper electrode plate 53 and the adsorption surface. Accordingly, it is possible to obtain high responsivity to temperature control and uniformly heat the wafer W.

In the present embodiment, the manufacturing cost can be lowered as compared with in the conventional art since the electrostatic chuck 24 is manufactured by the thermal spraying method instead of the hot press method. Moreover, since the electrostatic chuck 24 is fixedly joined to the top surface of the susceptor 12 by the thermal spraying method, an adhesive having a low radical resistance need not be used to thereby lengthen a life span of the electrostatic chuck 24. Further, the responsivity and the deformation resistance can also be improved due to a porous structure produced by the thermal spraying method.

In the present embodiment, the upper electrode plate 53 of the heater 52 also serves as the HV electrode plate for electrostatically attracting the wafer W. Therefore, it attracting and holding the wafer W and also heating the wafer W can be performed simultaneously, for example. Moreover, as compared with the conventional electrostatic chuck including the spiral heater, or the like, it is possible to reduce the number of electromagnetic wave leakage filters required to be provided between electrode plates and power supplies.

Figure 3A:
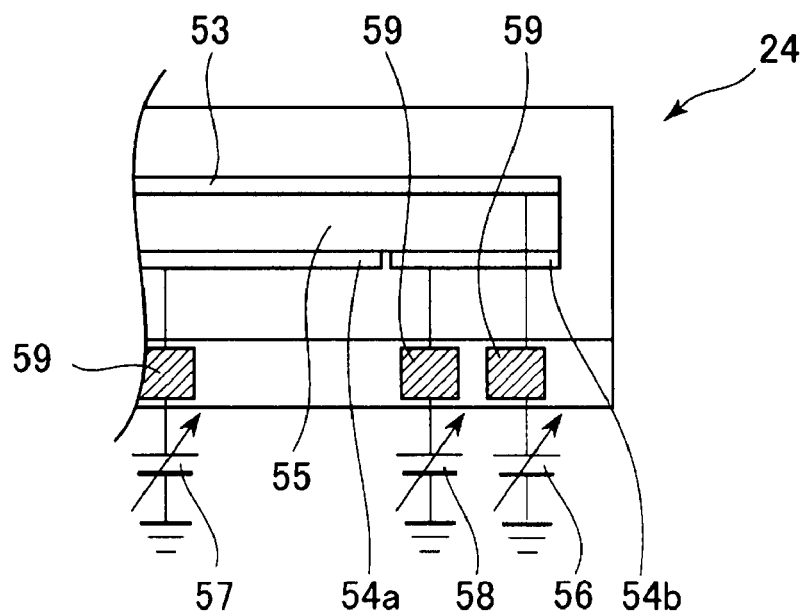
FIG. 3A is an example showing an arrangement of electromagnetic wave leakage filters in accordance with the present embodiment.
Figure 3B:
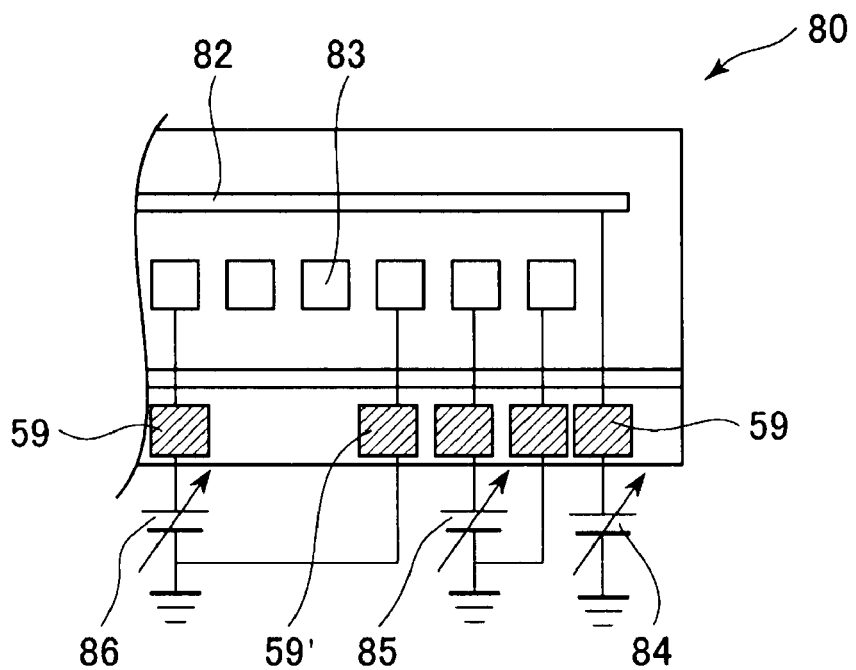
FIG. 3B is an example showing an arrangement of electromagnetic wave leakage filters according to a conventional art.

FIG. 3A is an example showing the arrangement of electromagnetic wave leakage filters 59 are arranged in accordance with the present embodiment and FIG. 3B is an example showing the arrangement of electromagnetic wave leakage filters 59 are arranged according to a conventional art.

As shown in FIG. 3A, in the electrostatic chuck 24 in accordance with the present embodiment, the three electromagnetic wave leakage filters 59 are arranged between the DC power supplies 56, 57, and 58 and the upper surface electrode plate 53, the lower inner electrode plate 54a, and the lower outer electrode plate 54b, respectively. In contrast, as shown in FIG. 3B, in the conventional electrostatic chuck 80, a total of 5 electromagnetic wave leakage filters 59 are arranged between the electrode plate 82 and the corresponding DC power supply 84 and between certain portions of the spiral heaters 83 and the corresponding DC power supplies 85 and 86.

It is necessary that the number of the electromagnetic wave leakage filters 59 corresponds to that of electrical lines connected to the DC power supplies. Accordingly, since the upper electrode plate 53 of the heater 52 serves as the HV electrode plate for attracting the wafer W in the present embodiment, it is possible to reduce the number of the electrical lines, thereby decreasing the number of the required electromagnetic wave leakage filters as compared with in the conventional art.

In the present embodiment, since the lower electrode plate 54 is divided into the lower inner electrode plate 54a and the lower outer electrode plate 54b, it is possible to precisely control each temperature of an inner portion and an outer portion of the wafer W by individually heating the inner portion and the outer portion.

In the present embodiment, when viewed from the lower inner electrode plate 54a, there is a resistance corresponding to a part of the resistor 55 in contact with the lower inner electrode plate 54a between the lower inner electrode plate 54a and the upper electrode plate 53. When viewed from the lower outer electrode plate 54b, there is a resistance corresponding to a part of the resistor 55 in contact with the lower outer electrode plate 54b between the lower outer electrode plate 54b and the upper electrode plate 53. Between the lower inner electrode plate 54a and the lower outer electrode plate 54b, there is a resistance corresponding to a gap therebetween.

Figure 4:
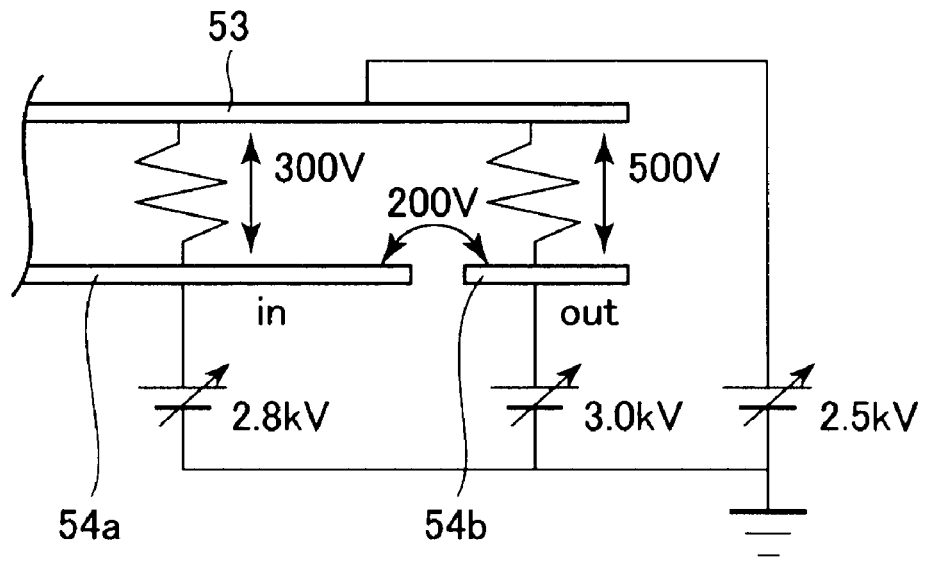
FIG. 4 shows DC voltages supplied to a upper electrode plate, a lower inner electrode plate, and a lower outer electrode plate and the relationship between the DC voltages supplied thereto.
Figure 5:
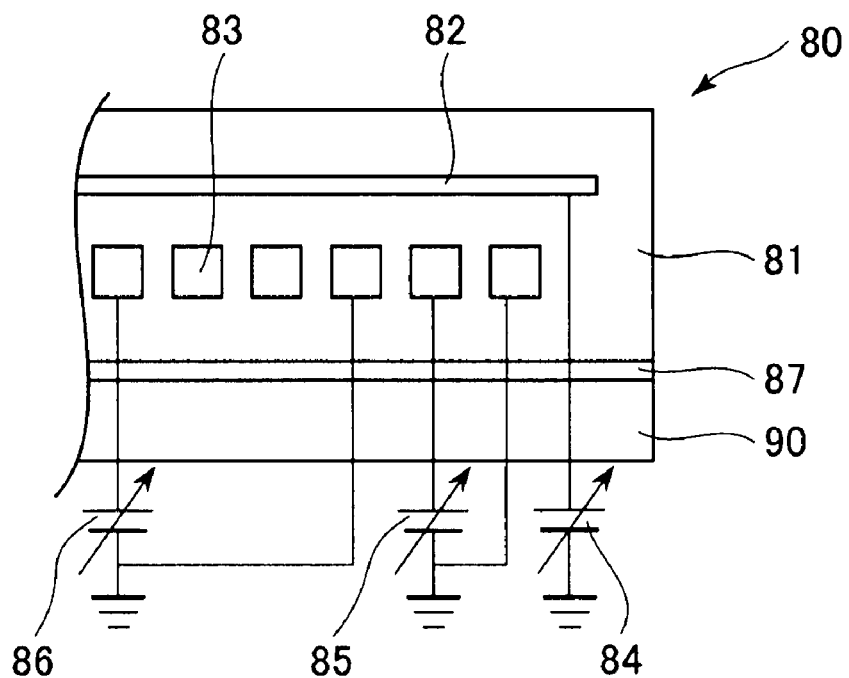
FIG. 5 is a partially enlarged cross sectional view showing a prior art electrostatic chuck.

FIG. 4 shows DC voltages supplied to the upper electrode plate 53, the lower inner electrode plate 54a, and the lower outer electrode plate 54b and the relationship between the DC voltages supplied thereto.

In FIG. 4, there occur resistances depending on surface areas of electrode plates or the like between the electrode plates. Further, in this example, potential differences of, e.g., 300 V, 500 V, and 200 V are generated between the upper electrode plate 53 and the lower inner electrode plate 54a, the upper electrode plate 53 and the lower outer electrode plate 54b, and the lower inner and the lower outer electrode plate 54a and 54b, respectively, and currents flow between the electrode plates based on the potential differences and resistances therebetween.

A ceramic is filled in the gap between the lower inner and the lower outer electrode plate 54a and 54b, and the distance therebetween is large enough to produce a large resistance therebetween to render almost no current flow therebetween. As a result, the power consumption therebetween is negligible.

In the present embodiment, the plate-shaped resistor 55 may be divided into two parts, e.g., a circular inner part and an annular outer part corresponding to the shapes of the lower inner and the lower outer electrode plate 54a and 54b, respectively. Accordingly, it is possible to more precisely control each temperature of the inner portion and the outer portion of the wafer W. Moreover, the inner part and the outer part of the divided resistor 55 may have different materials and/or different thicknesses. Therefore, it is possible to more precisely control the temperatures by using the different resistivities of the inner part and the outer part.

The lower electrode plate 54 is divided into the two parts in the present embodiment. However, instead of the lower electrode plate 54, the upper electrode plate 53 may be divided into an inner part and an outer part.

In the present embodiment, the temperature of the wafer W mounted on the electrostatic chuck 24 is basically controlled by adjusting the temperature of a coolant or the like supplied from the chiller unit (not shown) to the coolant path 27 arranged below the electrostatic chuck 24 inside the susceptor 12. Accordingly, the heater 52 is optionally used for basic heating, for example. The heater 52 is controlled, e.g., in synchronization with on/off of the upper electrode plate 53 for electrostatically attracting the wafer W.

In the present embodiment, a uniform electrostatic effect for electrostatically holding the wafer W can be obtained by applying the constant DC voltage to the upper electrode plate 53 of the electrostatic chuck 24. Accordingly, it is possible to change the amount of heat generated by the heater to heat the wafer W by adjusting the DC voltage applied to each of the lower inner and the lower outer electrode plate 54a and 54b without change of the voltage supplied to the upper electrode plate 53. Moreover, it is possible to electrostatically hold the wafer W and also turn off the heater.

The substrate to be processed in the present embodiment is not limited to a wafer for semiconductor devices. For example, the substrate may be one of various substrates such as a photomask, a CD substrate, a print substrate, and a substrate for use in a liquid crystal display (LCD) or a flat panel display (FPD).

While the invention has been shown and described with respect to the embodiments, it will be understood by those skilled in the art that various changes and modification may be made without departing from the scope of the invention as defined in the following claims.

What is claimed is:

1. A mounting table having a susceptor and an electrostatic chuck provided on the susceptor for electrostatically attracting a target substrate to the mounting table, wherein the electrostatic chuck comprising:
   an electrostatic chuck main body; and
   a heater provided inside the electrostatic chuck main body and having
      a first electrode provided at an upper part of the electrostatic chuck;
      a second electrode disposed under the first electrode; and
      a plate-shaped resistor interposed between the first electrode and the second electrode,
   wherein the second electrode is divided into an inner electrode plate and an outer electrode plate, and
   wherein one of the first electrode and the second electrode serves as a high voltage electrode for electrostatically attracting the target substrate.

2. The mounting table of claim 1, wherein the plate-shaped resistor is divided into two parts in contact with the inner electrode plate and the outer electrode plate of the second electrode.

3. The mounting table of claim 1, wherein the second electrode, the plate-shaped resistor, the first electrode, and a first insulating layer are successively coated on a second insulating layer serving as a base by a thermal spraying method to form the electrostatic chuck.

4. The mounting table of claim 1, wherein the plate-shaped resistor is made of a material in which a metal oxide and a ceramic are mixed.

5. The mounting table of claim 4, wherein the plate-shaped resistor is made of the material of $Al_2O_3$ and $TiO_2$.

6. A substrate processing apparatus having a processing chamber for processing a target substrate, a mounting table provided inside the processing chamber, and an exhaust pipe for exhausting the processing chamber, wherein the mounting table having a susceptor and an electrostatic chuck provided on the susceptor for electrostatically attracting the target substrate to the mounting table, the electrostatic chuck comprising:
   an electrostatic chuck main body; and
   a heater provided inside the electrostatic chuck main body and having
      a first electrode provided at an upper part of the electrostatic chuck;
      a second electrode disposed under the first electrode plate; and
      a plate-shaped resistor interposed between the first electrode and the second electrode,
   wherein the second electrode is divided into an inner electrode plate and an outer electrode plate, and
   wherein one of the first electrode and the second electrode serves as a high voltage electrode for electrostatically attracting the target substrate.

7. The apparatus of claim 6, wherein the plate-shaped resistor is divided into two parts in contact with the inner electrode plate and the outer electrode plate of the second electrode.

8. The apparatus of claim 6, wherein the second electrode, the plate-shaped resistor, the first electrode, and a first insulating layer are successively coated on a second insulating layer serving as a base by a thermal spraying method to form the electrostatic chuck.

9. The apparatus of claim 6, wherein the plate-shaped resistor is made of a material in which a metal oxide and a ceramic are mixed.

10. The apparatus of claim 9, wherein the plate-shaped resistor is made of the material of $Al_2O_3$ and $TiO_2$.

* * * * *